US 11,431,179 B2

(12) United States Patent
Heo et al.

(10) Patent No.: US 11,431,179 B2
(45) Date of Patent: Aug. 30, 2022

(54) INPUT CIRCUIT CAPABLE OF REDUCING DARK CURRENT

(71) Applicant: Continental Automotive GmbH, Hannover (DE)

(72) Inventors: Joon Heo, Gyeonggi-do (KR); SeungMin Jeon, Gyeonggi-do (KR); ByungGuk Kim, Gyeonggi-do (KR)

(73) Assignee: CONTINENTAL AUTOMOTIVE GMBH, Hannover (DE)

( * ) Notice: Subject to any disclaimer, the term of this patent is extended or adjusted under 35 U.S.C. 154(b) by 339 days.

(21) Appl. No.: 16/616,477

(22) PCT Filed: May 29, 2018

(86) PCT No.: PCT/EP2018/064114
§ 371 (c)(1),
(2) Date: Nov. 24, 2019

(87) PCT Pub. No.: WO2018/219973
PCT Pub. Date: Dec. 6, 2018

(65) Prior Publication Data
US 2021/0146797 A1  May 20, 2021

(30) Foreign Application Priority Data
May 30, 2017  (KR) .................. 10-2017-0066968

(51) Int. Cl.
*H02J 7/00* (2006.01)
*G01R 31/3828* (2019.01)
(Continued)

(52) U.S. Cl.
CPC .......... *H02J 7/0032* (2013.01); *B60L 3/0046* (2013.01); *B60L 3/0069* (2013.01); *B60L 58/14* (2019.02);
(Continued)

(58) Field of Classification Search
USPC .................. 320/134, 116, 136, 127, 152, 166
See application file for complete search history.

(56) References Cited

U.S. PATENT DOCUMENTS

| 6,800,965 B1 | 10/2004 | Turner et al. .................. 307/128 |
| 9,024,475 B2 | 5/2015 | Berkay et al. .................. 307/66 |

(Continued)

FOREIGN PATENT DOCUMENTS

| EP | 1 240 654 B1 | 2/2004 | ............... H01H 1/60 |
| EP | 2 479 362 A1 | 7/2012 | ............. B60R 16/03 |

(Continued)

OTHER PUBLICATIONS

Republic of Korea, Application No. 10-2017-0066968, 3 pages, dated Dec. 27, 2017.

(Continued)

*Primary Examiner* — Brian Ngo
(74) *Attorney, Agent, or Firm* — Slayden Grubert Beard PLLC (57) ABSTRACT

Various embodiments include an input circuit comprising: a pull-up resistor having one end thereof connected to an input terminal; a switch unit for establishing/blocking a connection between the other end of the pull-up resistor and a battery; and a dark current reduction unit connected between the other end of the pull-up resistor and the switch unit, and enabling different current paths to be formed in a normal mode and in a low power mode. The dark current reduction unit enables a current path in the low power mode to have a higher resistance than a current path in the normal mode.

8 Claims, 5 Drawing Sheets

(51) Int. Cl.
*B60L 58/14* (2019.01)
*B60L 3/00* (2019.01)
*B60R 16/023* (2006.01)

(52) U.S. Cl.
CPC ...... *B60R 16/0238* (2013.01); *G01R 31/3828* (2019.01)

(56) References Cited

U.S. PATENT DOCUMENTS

| | | | |
|---|---|---|---|
| 9,425,715 B2 | 8/2016 | Jeong | |
| 2004/0155629 A1* | 8/2004 | Kobayashi | H02J 7/0016 320/127 |
| 2005/0099156 A1* | 5/2005 | Brenner | H02J 7/0036 320/116 |
| 2010/0117602 A1* | 5/2010 | Matsui | H02J 7/0031 320/152 |
| 2011/0031939 A1* | 2/2011 | Funaba | H02M 1/36 320/166 |
| 2011/0228429 A1 | 9/2011 | Ueta et al. | 361/31 |
| 2011/0234168 A1 | 9/2011 | Park | 320/132 |
| 2013/0002204 A1* | 1/2013 | Oshima | H03K 19/018521 320/134 |
| 2013/0249492 A1 | 9/2013 | Kim et al. | 320/128 |
| 2014/0077620 A1 | 3/2014 | Nobusawa et al. | 307/112 |
| 2016/0162014 A1 | 6/2016 | Jeon | 713/323 |

FOREIGN PATENT DOCUMENTS

| | | | |
|---|---|---|---|
| JP | S53-52524 A | 5/1978 | ............. C03C 13/00 |
| JP | 2011-194902 A | 10/2011 | ............. B60R 16/02 |
| JP | 2012-236503 A | 12/2012 | ........... B60R 16/033 |
| JP | 5177255 B2 | 4/2013 | ........... B60R 16/033 |
| KR | 10-1029941 B1 | 4/2011 | ............. B60R 16/00 |
| KR | 2012-0006700 A | 1/2012 | ............ B60K 15/077 |
| KR | 2013-0113746 A | 10/2013 | ............. B60R 16/02 |
| KR | 10-1348154 B1 | 1/2014 | ............. B60R 16/02 |
| KR | 2016-0067511 A | 6/2016 | ............. B60L 11/18 |
| WO | 2018/219973 A1 | 12/2018 | ............. B60L 11/18 |

OTHER PUBLICATIONS

International Search Report and Written Opinion, Application No. PCT/EP2018/064114, 13 pages, dated Jul. 30, 2018.

\* cited by examiner

INPUT CIRCUIT CAPABLE OF REDUCING DARK CURRENT

CROSS-REFERENCE TO RELATED APPLICATIONS

This application is a U.S. National Stage Application of International Application No. PCT/EP2018/064114 filed May 29, 2018, which designates the United States of America, and claims priority to KR Application No. 10-2017-0066968 filed May 30, 2017, the contents of which are hereby incorporated by reference in their entirety.

TECHNICAL FIELD

The present disclosure relates to batteries. Various embodiments may include input circuits used in a system using a battery, and/or input circuits for receiving signals or information from the outside.

Battery

In general, in the case of a system using a battery, such as a vehicle, when the operation of the system is stopped and the system is thus switched to a sleep mode or a low power mode, the flow of current supplied to various devices (a starting device, a radio, and the like) from the battery is blocked. However, current for an immediate start-up, or battery current for some controllers is continuously supplied. Therefore, when it takes a long time for a vehicle to be delivered to a customer after the vehicle is manufactured, or when a vehicle is transported for a long period of time in order to be exported, or when a vehicle is left unused for a long period of time, battery current may be completely consumed or a battery may become weak due to dark current.

Accordingly, research into and development of various methods, devices, circuit configurations, and the like for reducing dark current are continuously underway. Meanwhile, the background art is described in Korean Patent Laid-Open Publication No. KR 10-2013-0113746 (Oct. 16, 2013).

SUMMARY

The teachings of the present disclosure include input circuits capable of reducing dark current in a low power mode. For example, some embodiments include an input circuit comprising: a pull-up resistor having one end thereof connected to an input terminal; a switch unit for establishing/blocking a connection between the other end of the pull-up resistor and a battery; and a dark current reduction unit connected between the other end of the pull-up resistor and the switch unit, and enabling different current paths to be formed in a normal mode and in a low power mode, wherein the dark current reduction unit enables a current path in the low power mode to have a higher resistance than a current path in the normal mode.

In some embodiments, there is a protection resistor connected between the input terminal and an output terminal; and a voltage distribution resistor connected to the output terminal.

In some embodiments, there is a control unit connected to the output terminal is configured to detect the on/off state of an external switch unit connected between the input terminal and ground.

In some embodiments, the control unit is configured to control the operation of the switch unit and the operation of the dark current reduction unit.

In some embodiments, by means of the switch unit, the other end of the pull-up resistor is continuously connected to the battery in the normal mode, and the other end of the pull-up resistor is intermittently connected to the battery in the low power mode.

In some embodiments, the dark current reduction unit comprises a switch closed in the normal mode and opened in the low power mode, and a resistor connected to the switch in parallel.

As another example, some embodiments include an input circuit comprising: a pull-down resistor having one end thereof connected to an input terminal; a switch unit for establishing/blocking a connection between the other end of the pull-down resistor and ground; and a dark current reduction unit connected between the other end of the pull-down resistor and the switch unit, and enabling different current paths to be formed in a normal mode and in a low power mode, wherein the dark current reduction unit enables a current path in the low power mode to have a higher resistance than a current path in the normal mode.

In some embodiments, there is a protection resistor connected between the input terminal and an output terminal; and a voltage distribution resistor connected to the output terminal.

In some embodiments, a control unit connected to the output terminal is configured to detect the on/off state of an external switch unit connected between the input terminal and a battery.

In some embodiments, the control unit is configured to control the operation of the switch unit and the operation of the dark current reduction unit.

In some embodiments, by means of the switch unit, the other end of the pull-down resistor is continuously connected to ground in the normal mode, and the other end of the pull-down resistor is intermittently connected to ground in the low power mode.

In some embodiments, the dark current reduction unit comprises a switch closed in the normal mode and opened in the low power mode, and a resistor connected to the switch in parallel.

DETAILED DESCRIPTION

In some embodiments, an input circuit incorporating teachings of the present disclosure includes a pull-up resistor having one end thereof connected to an input terminal; a switch unit for switching, i.e. establishing/blocking, a connection between the other end of the pull-up resistor and a battery; and a dark current reduction unit connected between the other end of the pull-up resistor and the switch unit, and enabling different current paths to be formed in a normal mode and in a low power mode, wherein the dark current reduction unit enables a current path in the low power mode to have a higher electrical resistance than a current path in the normal mode.

In some embodiments, the input circuit further includes a protection resistor connected between the input terminal and an output terminal; and a voltage distribution resistor connected to the output terminal.

In some embodiments, there is a control unit connected to the output terminal is configured to detect the on/off state of an external switch unit connected between the input terminal and ground.

In some embodiments, the control unit is configured to control the operation of the switch unit and the operation of the dark current reduction unit.

In some embodiments, by means of the switch unit, the other end of the pull-up resistor is continuously connected to the battery in the normal mode, and the other end of the pull-up resistor is intermittently connected to the battery in the low power mode.

In some embodiments, the dark current reduction unit includes a switch closed in the normal mode and opened in the low power mode, and a resistor connected to the switch in parallel.

In some embodiments, an input circuit incorporating teachings of the present disclosure includes a pull-down resistor having one end thereof connected to an input terminal; a switch unit for switching, i.e. establishing/blocking, a connection between the other end of the pull-down resistor and ground; and a dark current reduction unit connected between the other end of the pull-down resistor and the switch unit, and enabling different current paths to be formed in a normal mode and in a low power mode, wherein the dark current reduction unit enables a current path in the low power mode to have a higher electrical resistance than a current path in the normal mode.

In some embodiments, there is a protection resistor connected between the input terminal and an output terminal; and a voltage distribution resistor connected to the output terminal.

In some embodiments, a control unit connected to the output terminal is configured to detect the on/off state of an external switch unit connected between the input terminal and the battery.

In some embodiments, the control unit is configured to control the operation of the switch unit and the operation of the dark current reduction unit.

In some embodiments, by means of the switch unit, the other end of the pull-down resistor and ground are continuously connected in the normal mode, and the other end of the pull-down resistor and ground are intermittently connected in the low power mode.

In some embodiments, the dark current reduction unit includes a switch closed in the normal mode and opened in the low power mode, and a resistor connected to the switch in parallel.

In some embodiments, an input circuit capable of reducing dark current incorporating teachings of the present disclosure has the effect of reducing dark current in a low power mode by enabling a current path in the low power mode to have a higher resistance than a current path in a normal mode.

Hereinafter, exemplary embodiments of an input circuit capable of reducing dark current incorporating teachings of the present invention will be described with reference to the accompanying drawings. In this context, the thicknesses of lines or the sizes of the components shown in the drawings may be exaggerated for the clarity and ease of understanding of the description. In addition, the following terms are defined in relation to functions in the present invention, and the definition thereof may vary depending on the intention or practice of a user or an operator. Therefore, the definition of these terms should be based on the content throughout this specification.

It should be understood that when any component is said to be connected in the present disclosure, the component may be either directly connected or else connected through other component(s).

Figure 1:
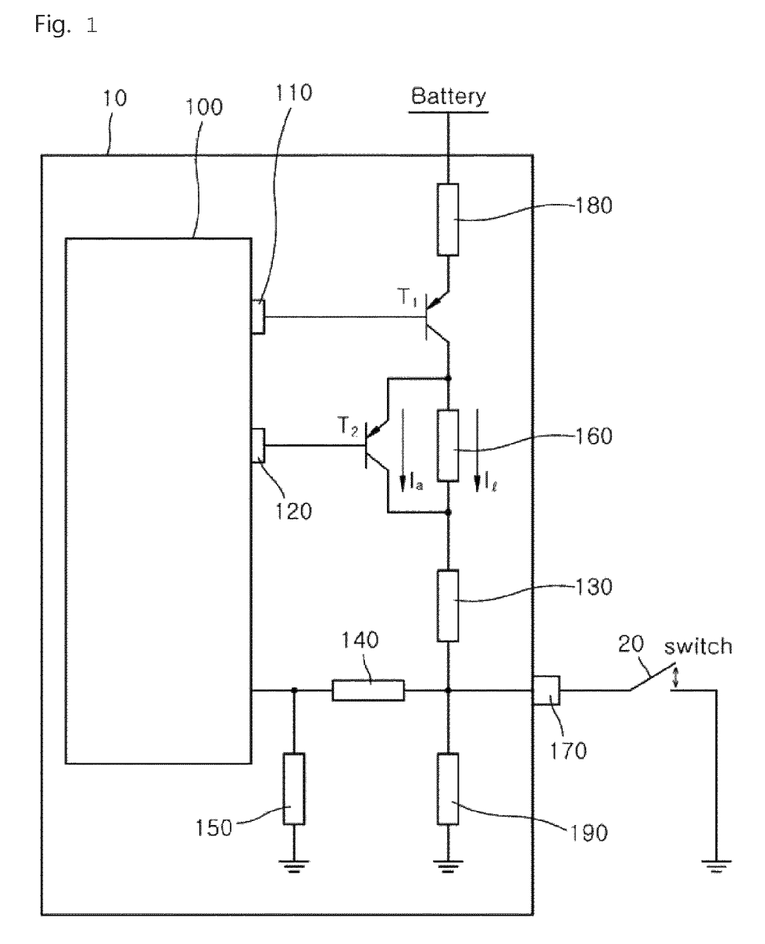
FIG. 1 is a view of an example input circuit capable of reducing dark current incorporating teachings of the present disclosure.
Figure 2:
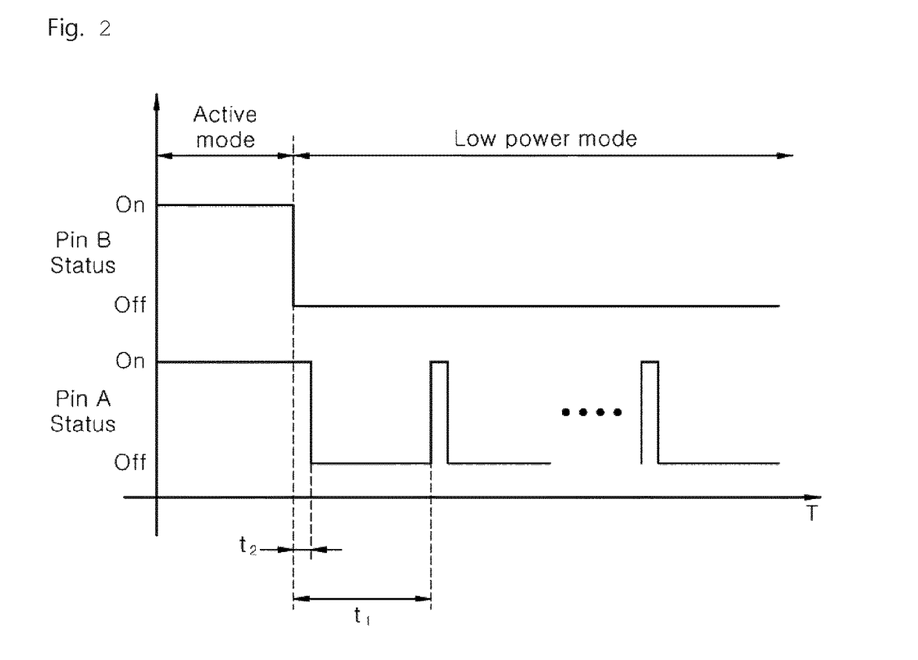
FIG. 2 is a view for explaining the operation of an internal switch in an input circuit capable of reducing dark current incorporating teachings of the present disclosure.
Figure 3:
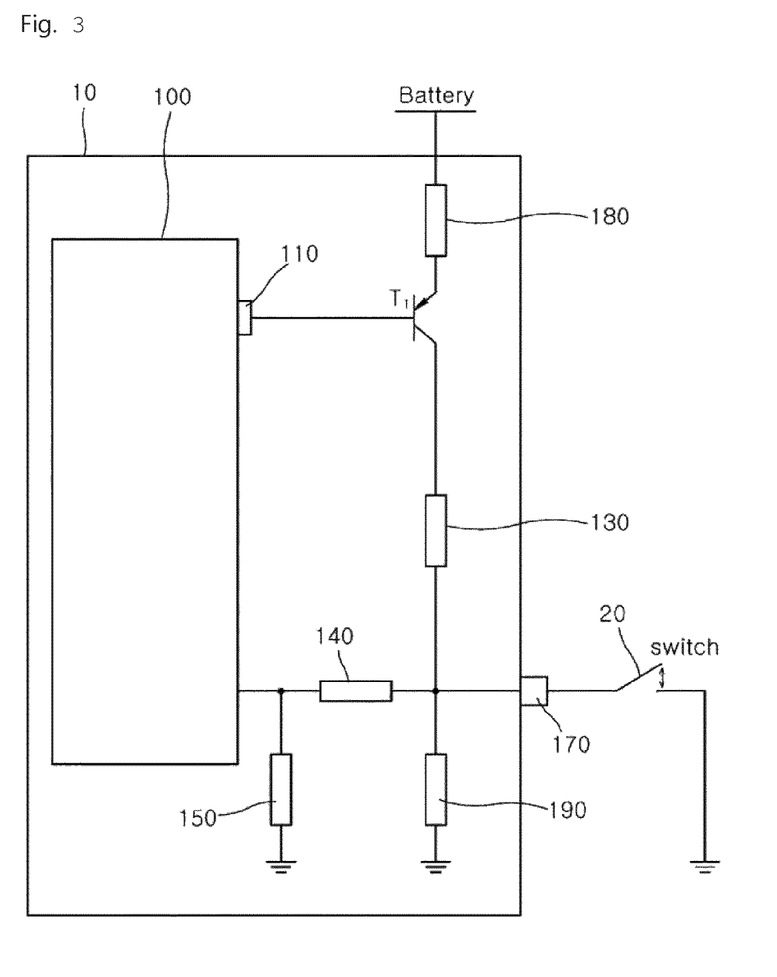
FIG. 3 is a view for explaining the effects of an input circuit capable of reducing dark current.

FIG. 1 is a view of an example input circuit capable of reducing dark current incorporating teachings of the present disclosure. FIG. 2 is a view for explaining the operation of an internal switch in an input circuit capable of reducing dark current incorporating teachings of the present disclosure. FIG. 3 is a view for explaining the effects of an input circuit capable of reducing dark current incorporating teachings of the present disclosure. With reference to FIGS. 1 to 3, an input circuit capable of reducing dark current incorporating teachings of the present disclosure will be described below.

As seen in FIG. 1, an input circuit incorporating teachings of the present disclosure may be used in a system using a battery, and serves to enable a control unit 100 to detect the on/off state of an external switch unit 20. Such an input circuit may be provided, for example, in various ECUs 10 mounted on a vehicle, to enable the control unit 100 in the ECU 10 to detect the on/off state of the external switch unit 20. In other words, as seen in FIG. 1, an input terminal of the input circuit is connected to the external switch unit 20 via a connector 170, and an output terminal of the input circuit is connected to the control unit 100.

However, FIGS. 1 to 3 are examples in which the input circuit is configured in the form of a pull-up circuit. In this case, the external switch unit 20 may be connected between the input terminal and ground. Such an external switch unit 20 may be, for example, a switch related to a device requiring a response even when a vehicle is turned off, such as a switch opened and closed by a smart key control module of a vehicle, and a switch opened and closed according to a driver's start signal. Therefore, the ECU 10 in which the input circuit is installed may be woken up and operated intermittently (cyclically) even in a low power mode.

In this case, the low power mode refers to, for example, a mode in which a vehicle operates when a driver is not in the vehicle, a mode in which a vehicle operates after the vehicle is turned off, and the like. In the present disclosure, a normal mode (which is also called "an active mode") refers to a state which is not the low power mode.

As seen in FIG. 1, the input circuit may include a pull-up resistor 130 having one end thereof connected to the input terminal, a switch unit $T_1$ for switching, i.e. establishing/blocking, a connection between the other end of the pull-up resistor 130 and a battery, and a dark current reduction unit 160/$T_2$ connected between the other end of the pull-up resistor 130 and the switch unit $T_1$, a protection resistor 140 connected between the input terminal and the output terminal, and a voltage distribution resistor 150 connected to the output terminal.

In the illustrated embodiment, the operation of the switch unit $T_1$ and the operation of the dark current reduction unit 160/$T_2$ may be controlled by the control unit 100. The detailed description thereof is as follows with reference to FIG. 2. The switch unit $T_1$ may be opened and closed according to a signal inputted through a Pin A 110. The control unit 100 continuously outputs an ON(HIGH) signal in the normal mode such that the switch unit $T_1$ is in a closed state, and outputs an OFF(LOW) signal as default (or does not output a signal) in a low power mode such that the switch unit $T_1$ is in an opened state. However, the control unit 100 may intermittently or cyclically output the ON(HIGH) signal (for example: output the ON signal for a time period $t_2$ in $t_1$ intervals) such that the switch unit $T_1$ is in a closed state intermittently or cyclically.

In other words, the control unit 100 may continuously detect the state of the external switch unit 20 in the normal mode but may only intermittently detect the state of the external switch unit 20 in the low power mode. The dark current reduction unit 160/$T_2$ may be composed of a switch $T_2$ and a dark current reduction resistor 160 connected to the switch $T_2$ in parallel.

The operation of such a dark current reduction unit 160/$T_2$ may be controlled according to a signal inputted through a Pin B 120. The control unit 100 operates in such a manner that it continuously outputs the ON(HIGH) signal in the normal mode, and continuously outputs the OFF(LOW) signal or does not output any signal in the low power mode. Accordingly, the switch $T_2$ is in a closed state in the normal mode, and in an opened state in the low power mode. That is, the dark current reduction unit 160/$T_2$ enables different current paths to be formed in the normal mode and in the low power mode, wherein a current path $I_1$ in the low power mode has a higher electrical resistance than a current path $I_a$ in the normal mode.

Conversely, the control unit 100 may detect the on/off state of the external switch unit 20 using a voltage change of the input terminal of the input circuit according to the opening and closing of the external switch unit 20. That is, when the external switch unit 20 is in an opened state, the voltage of the input terminal becomes a pull-up voltage, and this is reflected in the output terminal by the partial value of the protection resistor 140 and the voltage distribution resistor 150. In addition, when the external switch unit 20 is in the opened state, the voltage of the input terminal changes to a grounded state, and this is reflected in the output terminal. Therefore, the control unit 100 may detect the on/off state of the external switch unit 20 using a voltage change of the output terminal which reflects a voltage change of the input terminal of the input circuit.

The dark-current-reducing effect of the input circuit having the above-described configuration will be described below through comparison of FIG. 1 and FIG. 3. As described above, in the normal mode, since current flows through the $I_a$ path, the input circuit illustrated in FIG. 1 and the input circuit illustrated in FIG. 3 exhibit almost the same results (magnitude of through-current, values inputted to the control unit 100, and the like). However, in the low power mode, since current flows through the $I_1$ path as shown in FIG. 1, the total resistance value is increased so that dark current is reduced when compared with FIG. 3.

As a means for obtaining a similar effect to the above, increasing the resistance value of the pull-up resistor 130 may be considered. However, in the case of the pull-up resistor 130, there is a limitation to increasing the resistance value based on securing through-current in order to prevent oxide coating, and typically, through-current of 1 mA or more is required. In addition, a method of reducing overall power consumption by adjusting the $t_1$ and $t_2$ values may be considered instead of reducing the magnitude of current. However, there is a limitation to adjusting the $t_1$ and $t_2$ values due to constraints such as switch recognition sensitivity and minimum time for recognizing a signal in the control unit 100. Therefore, the input circuit according to the illustrated embodiment allows current to flow through the $I_a$ path in the normal mode to secure the required though-current, and allows current to flow through the $I_1$ path in the low power mode to reduce dark current.

In addition, the input circuit may further include a battery protector 180 connected between the switch unit $T_1$ and the battery, and an ESD protector 190 connected to the input terminal. In this case, the battery protector 180 and the ESD protector 190 may be composed of diodes and the like, and configurations of the battery protector 180 and the ESD protector 190 are well known in the technical field of the present invention, and thus the detailed description thereof will be omitted.

As seen in FIG. 1, the input terminal provides a node to which the pull-up resistor 130, the protection resistor 140, and the ESD protector 190 are connected and the output terminal provides a node to which the protection resistor 140 and the voltage distribution resistor 150 are connected.

Figure 4:
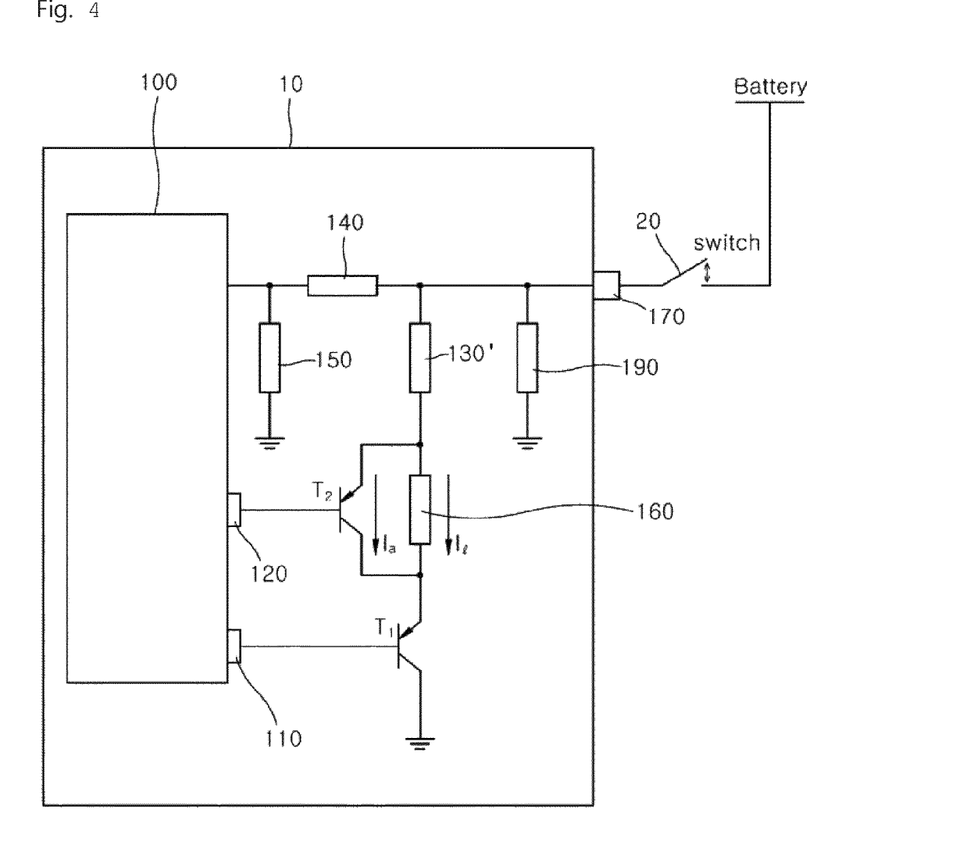
FIG. 4 is a view of an example input circuit capable of reducing dark current incorporating teachings of the present disclosure.
Figure 5:
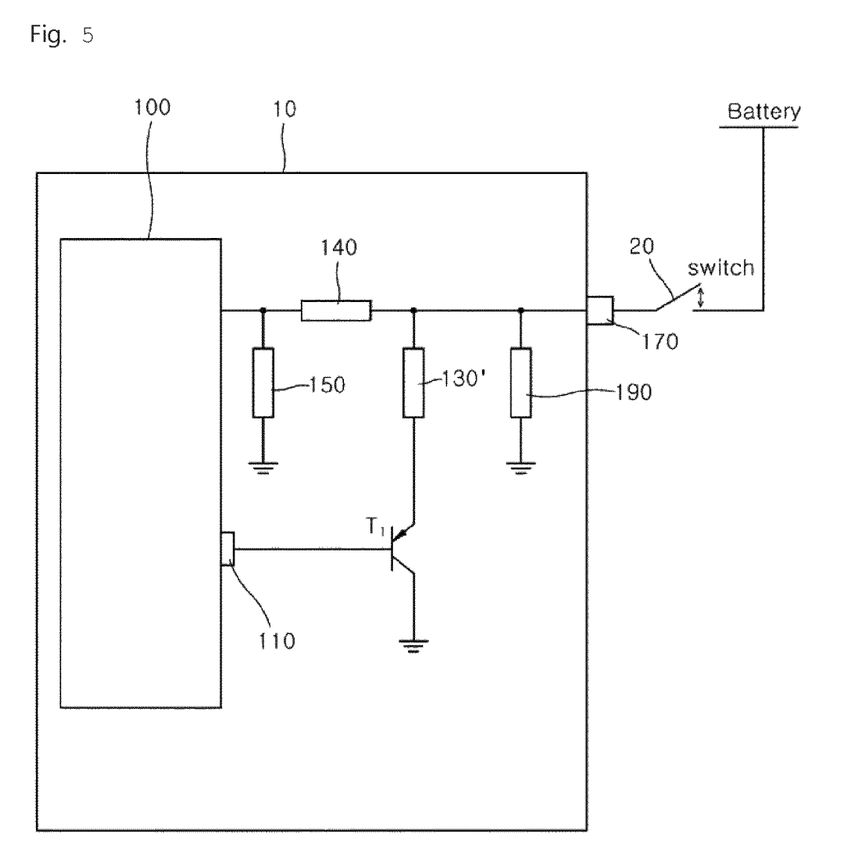
FIG. 5 is a view for explaining the effects of an input circuit capable of reducing dark current.

FIG. 4 is a view of an example input circuit capable of reducing dark current according to another embodiment of the present teachings, and FIG. 5 is an exemplary view for explaining the effects of an input circuit capable of reducing dark current. FIGS. 4 and 5 show embodiments in which the input circuit is configured in the form of a pull-down circuit. In this case, the external switch unit 20 may be connected between the input terminal and the battery.

As seen in FIG. 4, the input circuit according to the illustrated embodiment may include a pull-down resistor 130' having one end thereof connected to an input terminal, a switch unit $T_1$ for switching, i.e. establishing/blocking, a connection between the other end of the pull-down resistor 130' and ground, and a dark current reduction unit 160/$T_2$ connected between the other end of the pull-down resistor 130' and the switch unit $T_1$, a protection resistor 140 connected between the input terminal and an output terminal, and a voltage distribution resistor 150 connected to the output terminal.

In the illustrated embodiment, the operation of the switch unit $T_1$ and the operation of the dark current reduction unit 160/$T_2$ may be controlled by the control unit 100, and the switch unit $T_1$ and the dark current reduction unit 160/$T_2$ may be opened and closed according to a signal inputted through the Pin A 110 and the Pin B 120 shown in FIG. 2, respectively. That is, in the illustrated embodiment, the operation of the switch unit $T_1$ and the operation of the dark current reduction unit 160/$T_2$ may be the same as the operation of the switch unit $T_1$ and the operation of the dark current reduction unit 160/$T_2$ described above with reference to FIGS. 1 to 3. Therefore, in the normal mode, since current flows through an $I_a$ path, the input circuit illustrated in FIG. 4 and the input circuit illustrated in FIG. 5 exhibit almost the same results (magnitude of through-current, values inputted to the control unit 100, and the like). However, in the low power mode, since current flows through the $I_1$ path as shown in FIG. 4, a resistance value on the pull-down path is increased so that dark current is reduced when compared with FIG. 5.

As such, an input circuit capable of reducing dark current according to an embodiment of the present invention reduces dark current in a low power mode by enabling a current path in the low power mode to have a higher resistance than a current path in a normal mode. Although teachings of the present disclosure have been described with reference to the embodiments illustrated in the drawings, this is merely exemplary. It will be understood by those skilled in the art that various modifications and equivalent embodiments thereto may be implemented.

REFERENCE NUMERALS

10 ECU
20 External switch unit
100 Control unit
110 Pin A
120 Pin B
130 Pull-up resistor
130' Pull-down resistor
140 Protection resistor
150 Voltage distribution resistor
160 Dark current reduction resistor
170 Connector
180 Battery protector
190 ESD protector
$T_1$ switch unit
$T_2$ switch
$I_1$ current path
$I_a$ current path

What is claimed is:

1. An input circuit comprising:
 a pull-up resistor having one end thereof connected to an input terminal;
 a first switch for establishing/blocking a connection between the other end of the pull-up resistor and a battery, wherein a normal mode of operating includes establishing a continuous connection and a low power mode includes establishing an intermittent connection and wherein the pull-up resistor provides the sole path from the battery to the input terminal; and
 a dark current reduction unit connected between the other end of the pull-up resistor and the switch, and enabling different current paths to be formed in the normal mode and in the low power mode, the dark current reduction unit including a second switch closed in the normal mode and a second resistor connected in parallel to the second switch;
 wherein the dark current reduction unit establishes a low power current path in the low power mode through the second resistor with a higher resistance than a normal current path through the second switch established in the normal mode.

2. The input circuit as claimed in claim 1, further comprising:
 a protection resistor connected between the input terminal and an output terminal; and
 a voltage distribution resistor connected to the output terminal.

3. The input circuit as claimed in claim 2, further comprising a control unit connected to the output terminal and configured to detect the on/off state of an external switch unit connected between the input terminal and ground.

4. The input circuit as claimed in claim 3, wherein the control unit is configured to control the operation of the switch unit and the operation of the dark current reduction unit.

5. An input circuit comprising:
 a pull-down resistor having one end thereof connected to an input terminal;
 a first switch for establishing/blocking a connection between the other end of the pull-down resistor and ground, wherein a normal mode of operating includes establishing a continuous connection and a low power mode include establishing an intermittent connection and wherein the pull-down resistor provides the sole path from the input terminal to ground; and
 a dark current reduction unit connected between the other end of the pull-down resistor and the switch, and enabling different current paths to be formed in the normal mode and in the low power mode, the dark current reduction unit including a second switch closed in the normal mode and a second resistor connected in parallel to the second switch;
 wherein the dark current reduction unit establishes a low power current path through the second resistor in the low power mode with a higher resistance than a current path through the second switch established in the normal mode.

6. The input circuit as claimed in claim 5, further comprising:
 a protection resistor connected between the input terminal and an output terminal; and
 a voltage distribution resistor connected to the output terminal.

7. The input circuit as claimed in claim 6, further comprising a control unit connected to the output terminal configured to detect the on/off state of an external switch unit connected between the input terminal and a battery.

8. The input circuit as claimed in claim 7, wherein the control unit is configured to control the operation of the switch unit and the operation of the dark current reduction unit.

* * * * *